United States Patent
Ruha et al.

(10) Patent No.: US 6,577,258 B2
(45) Date of Patent: Jun. 10, 2003

(54) ADAPTIVE SIGMA-DELTA DATA CONVERTER FOR MOBILE TERMINALS

(75) Inventors: Antti Ruha, Oulu (FI); Tarmo Ruotsalainen, Oulu (FI); Jussi-Pekka Tervaluoto, Oulu (FI); Jani Kauppinen, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/969,208

(22) Filed: Oct. 1, 2001

(65) Prior Publication Data

US 2003/0067404 A1 Apr. 10, 2003

(51) Int. Cl.[7] .................................................. H03M 3/00
(52) U.S. Cl. ........................................ 341/143; 341/155
(58) Field of Search ................................ 341/143, 155, 341/141; 340/7.37; 327/58; 710/69; 708/300

(56) References Cited

U.S. PATENT DOCUMENTS

| | | | | | |
|---|---|---|---|---|---|
| 5,051,981 A | * | 9/1991 | Kline | .......................... | 370/290 |
| 5,144,308 A | | 9/1992 | Norsworthy | | |
| 5,274,375 A | * | 12/1993 | Thompson | .................. | 341/143 |
| 5,345,406 A | * | 9/1994 | Williams | .................... | 708/300 |
| 5,392,043 A | * | 2/1995 | Ribner | ........................ | 341/143 |

(List continued on next page.)

FOREIGN PATENT DOCUMENTS

WO     WO 98/44626     10/1998

OTHER PUBLICATIONS

Multibit Σ–Δ A/D Converter Incorporating A Novel Class of Dynamic Element Matching Techniques; Leung, Bosco H et al; IEEE Transactions on Circuits and Systems II Analog and Digital Signal Processing, vol. 39 No. 1; Jan. 1992.

Linearity Enhancement of Multibit ΔΣ A/D and D/A Converters Using Data Weighted Averaging; Baird, Rex T. et al; IEEE Transactions on Circuits and Systems II Analog and Digital Signal Processing, vol. 42 No. 12; Dec. 1995.

A Noise–Shaping Coder Topology for 15+ Bit Converters; Carley, L. Richard; IEEE Journal of Solid–State Circuits, vol. 24, No. 2; Apr. 1989.

*Primary Examiner*—Jean Bruner Jeanglaude
(74) *Attorney, Agent, or Firm*—Harrington & Smith, LLP

(57) ABSTRACT

A multimode communications device includes an RF section and an analog-to-digital converter (ADC) located in a receive path between the RF section and a baseband section. The ADC includes a programmable signal converter core operable to perform ADC functions on a received RF signal in accordance with different types of mobile communication device operational modes, and further includes a multimode control function for programming the signal converter core as a function of a currently selected operational mode. The programmable signal converter core preferably includes a sigma-delta modulator, and a signal analysis function is provided for analyzing the received RF signal for dynamically programming the converter core to adapt to temporary signal and interference conditions by increasing or decreasing the performance of the signal converter. The signal analysis function may be embodied as a decimation filter having an input coupled to an output of the modulator, or by a digital signal processor forming a portion of a baseband section. The programmable signal converter core may be programmed to change the number of bits used by the sigma-delta modulator and/or a loop filter transfer function and loop filter coefficients, or a number of quantizer levels, or decimator coefficients and word width. The sigma-delta modulator bias currents may also be changed, as may a selected type of dynamic element matching function, each as a function of the selected mode. Other operational criteria that can be changed include the sigma-delta modulator oversampling ratio and/or a change from a switched capacitor to a resistor-capacitor circuit technique, or vice versa.

31 Claims, 6 Drawing Sheets

U.S. PATENT DOCUMENTS

| | | | |
|---|---|---|---|
| 5,446,917 A | * 8/1995 | Krisciunas et al. | 710/69 |
| 5,471,209 A | * 11/1995 | Sutterlin et al. | 341/143 |
| 5,557,642 A | * 9/1996 | Williams | 341/143 |
| 5,561,425 A | * 10/1996 | Therssen | 341/141 |
| 5,745,061 A | 4/1998 | Norsworthy et al. | |
| 5,778,312 A | * 7/1998 | Kawashima | 340/7.37 |
| 5,889,482 A | 3/1999 | Zarubinsky et al. | |
| 5,905,453 A | * 5/1999 | Kase | 341/143 |
| 5,952,947 A | * 9/1999 | Nussbaum et al. | 341/143 |
| 5,959,562 A | * 9/1999 | Wiesbauer | 341/143 |
| 5,982,315 A | * 11/1999 | Bazarjani et al. | 341/143 |
| 5,990,815 A | 11/1999 | Linder et al. | |
| 5,990,819 A | 11/1999 | Fujimori | |
| 6,005,506 A | * 12/1999 | Bazarjani et al. | 341/143 |
| 6,011,501 A | 1/2000 | Gong et al. | |
| 6,087,969 A | * 7/2000 | Stockstad et al. | 341/143 |
| 6,271,782 B1 | * 8/2001 | Steensgaard-Madsen | 341/143 |
| 6,320,529 B1 | * 11/2001 | Yasuda | 341/143 |
| 6,329,939 B1 | * 12/2001 | Swaminathan et al. | 327/58 |
| 6,369,730 B1 | * 4/2002 | Blanken et al. | 341/143 |
| 6,456,219 B1 | * 9/2002 | Schreiber et al. | 341/155 |

\* cited by examiner

RC

SC

ADAPTIVE SIGMA-DELTA DATA CONVERTER FOR MOBILE TERMINALS

TECHNICAL FIELD

These teachings relate generally to sigma-delta (SD) modulators of a type used in data converters and, more specifically, relate to the use of SD-based converters in equipment that places different demands on the performance and operation of the SD converter. Even more specifically, these teachings are directed to the data conversion of audio and RF signals at a digital baseband interface for enabling further processing either for RF transmission or for digital signal processing.

BACKGROUND

SD modulators used in analog-to-digital converters (ADCs) are well known in the art. Reference may be had, by example, to S. R. Norsworthy et al., "Delta-Sigma Data Converters", IEEE Press, NY, 1997, and to J. G. Proakis et al., Digital Signal Processing" Third Edition, Prentice-Hall, 1996.

Currently several air interface standards for mobile communications devices, such as cellular telephones, are in wide use, and the signal bandwidth and dynamic range are different in each standard. In one possible data conversion solution each of the RF-baseband (analog-to-digital (AD) and digital-to-analog (DA)) interfaces uses dedicated RF AD/DA converters with certain optimum numbers of bits and sampling rates for each targeted system and radio architecture. Furthermore, when one mobile communication device is required to support more than one standard, then more than one RF DA/AD converter will typically be required, e.g., one for each supported standard. This, however, results in an increased hardware cost and overhead.

Additionally, the conversion performance is typically designed according to predetermined worst-case signal conditions. This results in an overhead in performance under most usage conditions, which in turn can result in increased power consumption. For battery powered devices, such as typical cellular telephones and personal communicators, any increase in power consumption is detrimental to the goal of extending the talk and standby times.

A single-bit second-order sigma-delta modulator with a digital decimation filter is widely used for audio and RF converters. The virtues of the single-bit sigma-delta technique include a high achievable linearity and a wide dynamic range. However, these benefits come at the cost of a required high over-sampling ratio (OSR) and, therefore, increased current consumption. Due to stability reasons the highest practical order of the sigma-delta modulator is limited to two, and any possibilities for providing configurability by changing the order of the sigma-delta modulator are limited. Thus, the only practical parameter for configuring or adapting the sigma-delta modulator is the over-sampling ratio. However, in order to obtain a wide dynamic range a high over-sampling ratio is required.

As is known, oversampling analog-to-digital converters two parts: an analog modulator and a digital filter. The analog modulator receives an analog signal and produces a serial data stream having a bit rate which is much greater than the Nyquist sampling frequency. The quantization noise of the analog modulator is shaped to minimize the noise in the passband of interest, at the expense of higher noise outside of this passband. This is as opposed to distributing the noise evenly between DC and the modulator sampling frequency. The digital filter portion of the ADC is operable to filter and decimate the modulator representation of the analog input. Since the modulator quantization noise is shaped, the digital filter must filter this out-of-band quantization noise and reduce the output word frequency to the desired final sample frequency. Decimation is a well-known technique that is utilized in most oversampling ADCs.

Typically, oversampling ADCs utilize a fixed decimation filter architecture (usually SINC filters in combination with FIR filters) to realize a desired filter transfer function, and the decimation filter is arranged to reduce the sampling frequency of a digital information signal step-by-step such that no aliasing occurs. Various structures and embodiments of decimation filters are known. The common practice is to use one or several SINC filters in the first stage(s) due to their simplicity and efficiency, and to use FIR filters in the final stages. The order of the SINC filter is typically one order higher than the sigma-delta modulator in order to filter out the spectrally shaped quantization noise. The decimation ratio of the SINC filter is usually chosen to be one-fourth of the total decimation ratio (or oversampling ratio OSR) due to the consideration of the attenuation at the upper end of the passband. The FIR filter performs the final decimation to the desired sample frequency, and defines and equalizes for the final desired frequency response.

FIG. 1 shows a typical sigma-delta ADC topology, where the output of the analog sigma-delta modulator 10 is connected to an input of a decimation filter 12. The modulator 10 typically employs a loop filter (10A) that feeds a quantizer 10B, and an analog feedback path that includes a DAC 10C. The quantizer 10B typically is a 1-bit quantizer for linearity purposes and is of second order for stability reasons. The modulator 10 over-samples at a sampling rate of Fs, and the resulting data stream is gradually stage-by-stage decimated by the over-sampling ratio (OSR) to a lower rate (Fs/OSR), but higher resolution, signal (N bits) in the decimation filter 12. In a typical case the decimation filter 12 includes a data register 12A, a multiply and accumulate (MAC) unit 12B and a coefficients register 12C.

Instead of 1-bit quantization, a 2-bit or higher resolution quantization is beneficial for at least two reasons: the dynamic range is increased by at least 6 dB /per additional bit, and higher order modulators can be used without incurring stability problems.

Multi-bit sigma-delta techniques thus provide an additional degree of freedom for the configuration and adaptation of a sigma-delta data converter. Configuration and adaptation by changing the number of bits is an effective means for setting the converter performance at a level required in certain conditions. This is also an effective technique for use with low over-sampling ratios, when changing the order of the sigma-delta modulator is not appropriate. The use of cascaded sigma-delta modulators offers a possibility for increasing the order of the sigma-delta modulator and for configuring the modulator to simultaneously meet the requirements of different standards, such as the second generation (2G) digital cellular standard and the third generation (3G) digital cellular standard. Reference with regard to cascaded modulators and to changing the modulator order can be had to U.S. Pat. No. 6,087,969 "Sigma-delta Modulator and Method for Digitizing a Signal", by Stockstad et al. However, when the over-sampling ratio is low the benefits of modifying the order of the sigma-delta modulator are only marginally effective in the most critical cases.

As was noted, the dynamic range is increased 6dB for each additional bit, and can be increased even further if the modulator coefficients are configured simultaneously. Therefore, in a performance-wise optimum configuration the modulator coefficients are changed each time the number of quantization levels (bits) is altered.

SUMMARY OF THE PREFERRED EMBODIMENTS

The foregoing and other problems are overcome, and other advantages are realized, in accordance with the presently preferred embodiments of these teachings.

These teachings are directed to an adaptive sigma delta modulator that avoids the use of several RF (and audio) SD converters in a mobile communication device that is intended to operate in accordance with several air interface standards and under various signal conditions. The use of these teachings achieves this goal by providing a single sigma-delta modulator-based AD and or DA converter that is constructed so as to be adaptable to different system requirements by changing at least the number of bits used in the SD modulator. The loop filter parameters of the SD modulator may also be altered as required, and certain of the stages may be controlled to operate at lower bias currents.

Further in accordance with these teachings it becomes possible to controllably reduce the performance of the RF and data conversion signal paths in a controlled manner, thereby reducing the typical performance overhead lowering power consumption to achieve longer total operating times.

These teachings provide a technique to achieve an optimal performance-to-power consumption ratio by altering the number of bits in the sigma-delta modulator, by modify the modulator loop filter coefficients and by configuring the bias current levels. In that it is not required to change the order of the sigma-delta modulator, thus the decimation or post-filter characteristics (e.g., steepness) are not required to be modified, and the filter structure may be maintained essentially the same in each sigma-delta modulator operational mode. Only a relatively minor reconfiguration may be needed, such as changing the word width.

In certain cases it is also possible to switch the operation of the sigma-delta modulator (in the ADC) from discrete time operation (using switched capacitor (SC) techniques) to continuous time operation (using resistor-capacitor (RC) techniques) in order to relax the bandwidth requirements of the operational amplifiers used in the sigma-delta modulator. This enables even further savings in power consumption. This technique can be accomplished by replacing each switched capacitor and its associated switches with a resistor.

These teachings thus provide, in a multi-mode and an adaptive data converter, the following features: (a) the number of bits used in the sigma-delta modulator may be changed according to the desired mode of operation, and (b) the number of bits used in the sigma-delta modulator may be changed dynamically during operation according to signal conditions (signal strength, the presence or absence of interferers etc.) In addition, the loop filter transfer function and coefficients may be changed to maintain an optimum dynamic range when the number of bits is changed. The bias currents may also changed. Furthermore, the circuit techniques (switched capacitor to resistor-capacitor or vice versa) may be changed as a function of the operational mode.

The use of further techniques, such as dynamic element matching (DEM), can be employed to linearize the operation of the sigma-delta modulator. When configuring and adapting the data converter to a certain level of performance the DEM algorithm may also be altered to, for example, one of the following types: noise-shaping, data weighted averaging (DWA), clocked averaging (CLA) or random DEM. In the most compact form of configuration for medium or low resolution data conversion the DEM algorithm may be turned off completely to conserve power.

The sigma-delta modulator configuration and adaptation techniques in accordance with these teachings are applicable to audio signals found in speech, wide-band speech and music reproduction, as well as to RF data conversion, in all types of the mobile communication systems.

Conventional mixed signal technology is used and enhanced with digital configuration blocks in accordance with an aspect of these teachings.

The use of these teachings thus avoid the requirement to provide several standard-specific data converters in a multi-standard mobile communication device, thereby reducing hardware overhead and conserving both silicon area and overall power consumption.

These teachings provide a solution for implementing multi-mode data (RF and audio) converters for multi-standard communication devices. In addition, altering the number of bits and the bias currents accordingly enables one to maintain optimized performance and power consumption in response to prevailing signal conditions. With the configurable multi-bit modulator the decimation filter may also be configured to have a variable word width.

In one aspect these teachings provide a multimode communications device that includes an RF section and an analog-to-digital converter (ADC) located in a receive path between the RF section and a baseband section. The ADC comprising a programmable signal converter core operable to perform ADC functions on a received RF signal in accordance with different types of mobile communication device operational modes, and further comprising a multi-mode control function for programming the signal converter core as a function of a currently selected operational mode (e.g., 2G versus 3G system operation). The programmable signal converter core preferably includes a sigma-delta modulator, and there is further provided a signal analysis function for analyzing the received RF signal for dynamically programming the programmable signal converter core to adapt to temporary signal and interference conditions by one of increasing or decreasing the performance of the signal converter. The signal analysis function may be embodied as a decimation filter having an input coupled to an output of the sigma-delta modulator, or by a digital signal processor device that forms a portion of a baseband section.

The programmable signal converter core may be programmed to change the number of bits used by the sigma-delta modulator and/or a loop filter transfer function and loop filter coefficients, or a number of quantizer signal comparators or levels, or decimator coefficients and word width. The sigma-delta modulator bias currents may also be changed, as may a selected type of dynamic element matching function, each as a function of the selected mode. Other operational criteria that can be changed include, but are not limited to, the sigma-delta modulator oversampling ratio, and/or a change from a switched capacitor to a resistor-capacitor circuit technique, or vice versa.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein.

DETAILED DESCRIPTION OF THE PREFERRED EMBODIMENTS

Figure 1:
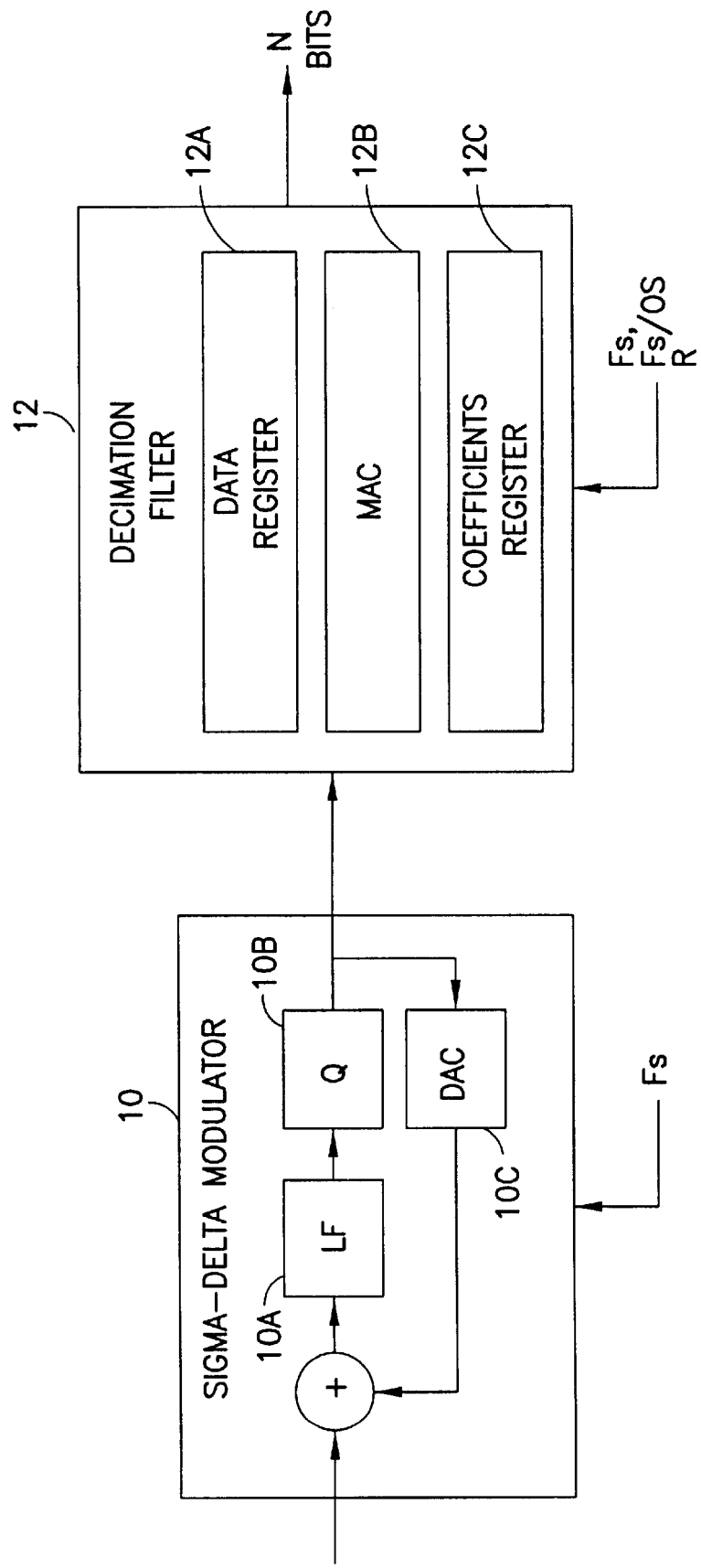
FIG. 1 is a block diagram of a typical second order sigma-delta AD converter.
Figure 2:
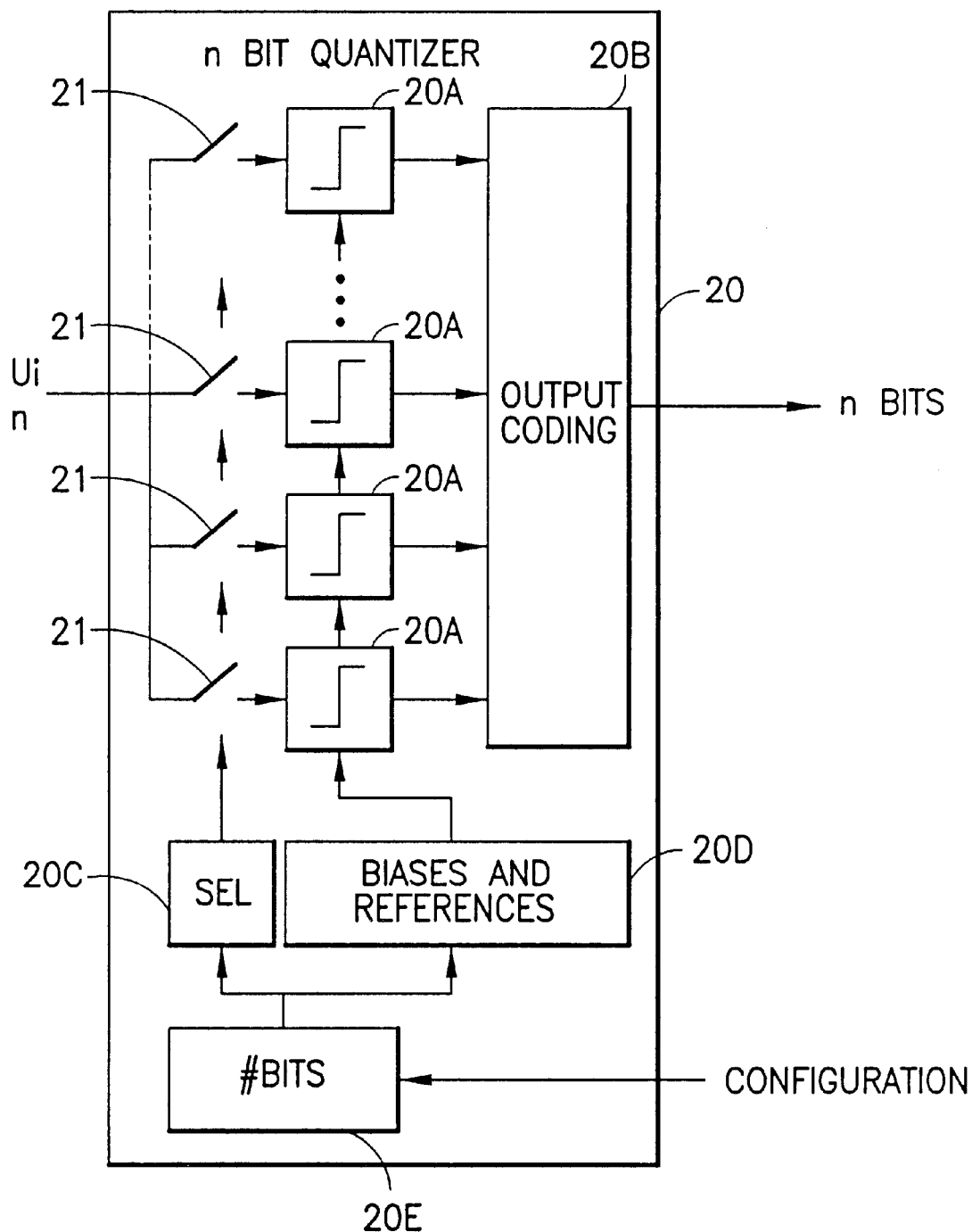
FIG. 2 is a block diagram of a configurable-bit quantizer.

FIG. 2 is a block diagram of a configurable-bit quantizer 20 in accordance with an aspect of these teachings. The quantizer 20 includes a plurality ($2^{n-1}$) comparators 20A that compare their respective input to one of a set of reference values generated by block 20D. For example, the block 20D could be implemented by a plurality of resistors connected in series between two reference voltages, with multiple taps being used to provide the desired reference signals to the comparators 20A. Block 20B applies a desired coding (e.g., twos-complement) to the bits received from the comparators 20A. Connecting the input signal to a desired number of comparators 20A are ($2^{n-1}$) switches 21 under the control of a selection block 20C fed from a register (#bits) 20E. Register 20E is loaded during operation and/or upon initialization by a configuration signal. The configuration signal can assume a value from one (for programming a 1-bit quantizer) to $2^{n-1}$, when it is desired to use all of the comparators 20A. If certain of the comparators 20A are not used, then it desirable that they be set in a stand-by mode by reducing their bias current to, for example, one tenth of the nominal, fully operational value. Alternatively, the unused comparators can be totally turned off, thereby conserving even more power. This can be achieved by the biases and references block 20D, which also receives as an input the output of the programming register 20E (# bits).

Figure 3:
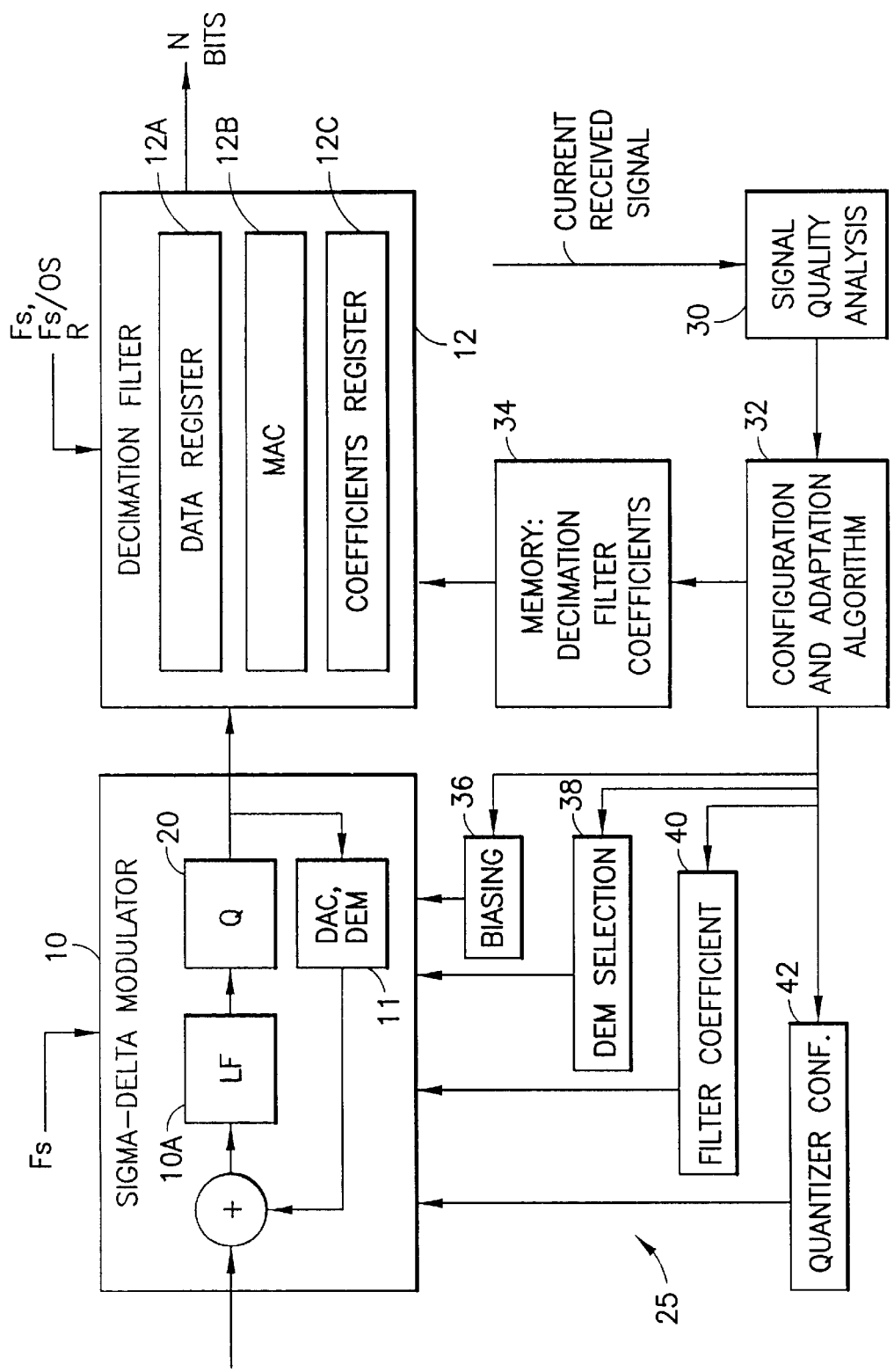
FIG. 3 is a block diagram of a configurable SDM, where the number of bits, the current, the coefficients and the word width used in the decimation filter may each be altered.

FIG. 3 is a block diagram of a configurable and adaptive sigma-delta AD converter 25. The converter 25 may be configured to operate in one predetermined mode, for example as a 2G GSM RF ADC, and in addition its performance maybe continuously adapted to prevailing signal conditions. Note that in this embodiment the sigma-delta modulator 10 includes a DAC, DEM block 11. The adaptation can be performed so as to provide a minimum signal quality that is required for reliable data transfer, this being affected mainly by the signal-to-noise ratio (SNR). The SNR can be analyzed downstream, such as by a digital signal processor (DSP) in the digital baseband processor (not shown), which may also control the configuration of the data converter 25.

It is known to use Dynamic Element Matching (DEM) techniques in the context of sigma-delta converters and 1-bit data formats. Reference in this regard can be had to, for example, U.S. Pat. No. 5,990,819, "D/A converter and delta-sigma D/A converter", by Fujimori and to U.S. Pat. No. 6,011,501, "Circuits, systems and methods for processing data in a one-bit format", by Gong et al. Dynamic element matching and sigma-delta modulator techniques are both well known in the art.

The configuration and adaptation tasks include the use of a signal quality analyzer 30 that feeds a configuration and adaptation algorithm block 32, which in turn sets one or more of the over-sampling ratio (OSR) with Fs, the number of bits via quantizer configuration block 42, the loop. filter coefficients via coefficients block 40, selects the DEM algorithm via DEM selection block 38 and may further set the bias currents in the analog stages, as required for each level of operational performance, via biasing block 36. The configuration and adaptation algorithm block 32 also provides an output to a memory 34 that stores decimation filter coefficients for the decimation filter 12. As will be made apparent below, the decimation filter 12 may be considered to be a simplest level of the signal quality analysis function 30 that is used to control the operation of the configurable sigma-delta modulator 10.

Figure 6A:
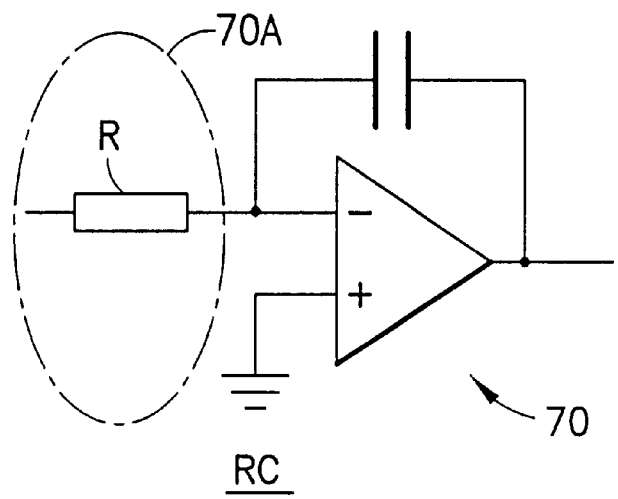
FIGS. 6A and 6B illustrate an integrator configured, respectively, in an RC integrator mode and in a SC integrator mode.
Figure 6B:
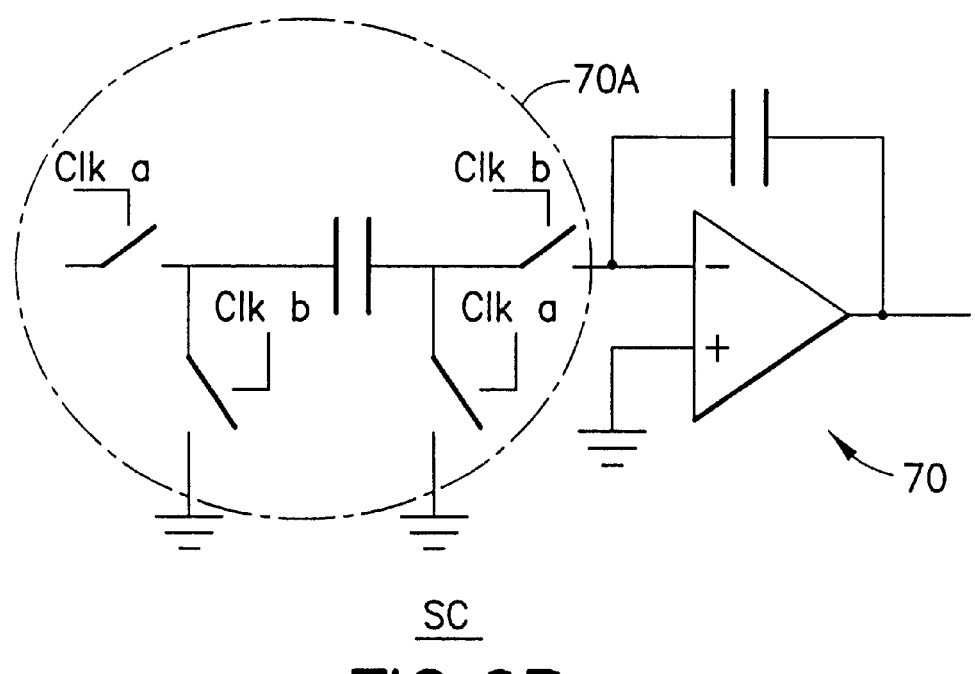

In certain cases it may also be desirable to switch the operation of the sigma-delta modulator (in the ADC) from discrete time operation (using switched capacitor (SC) techniques) to continuous time operation (using resistor-capacitor (RC) techniques) in order to relax the bandwidth requirements of the operational amplifiers used in the sigma-delta modulator. This enables even further savings in power consumption. As is illustrated in FIGS. 6A and 6B, this technique can be accomplished by replacing each switched capacitor and its associated switches with a resistor in the input structure 70A of the integrator 70.

When configuring and adapting the sigma-delta AD converter 25 to a certain level of performance the DEM algorithm may selected, for example, to be one of the following types: noise-shaping, data weighted averaging (DWA), clocked averaging (CLA) or random DEM. In the most compact form of configuration for medium or low resolution data conversion the DEM algorithm may be turned of completely to conserve power.

General reference with regard to DWA may be had to a publication: Rex T. Baird, Terry S. Fiez, Linearity Enhancement of Multibit ΔΣ A/D and D/A Converters Using Data Weighted Averaging, IEEE Transactions on Circuits and Systems—II: Analog and Digital Signal Processing, Vol. 42, No. 12, December 1995, and with regard to CLA reference can be made to Y. Sakina, Multibit Σ-Δ Analog to Digital Converters with Nonlinearity Correction Using Dynamic Barrel Shifting, M.A.Sc thesis, ERL, Univ. California at Berkeley, 1990. Other types of DEM techniques may be employed as well.

These teachings may be used to advantage in, by example, a multi-mode cellular telephone that combines both 2G and 3G compatibility. These teachings may also be applied with advantage to other applications where it is beneficial to provide for the configuration and adaptation of the sigma-delta modulator to prevailing signal conditions, by using the digital signal for signal quality analysis purposes, and by controlling the number of bits in multi-bit devices to implement, for example, a radio frequency AD converter.

Figure 4:
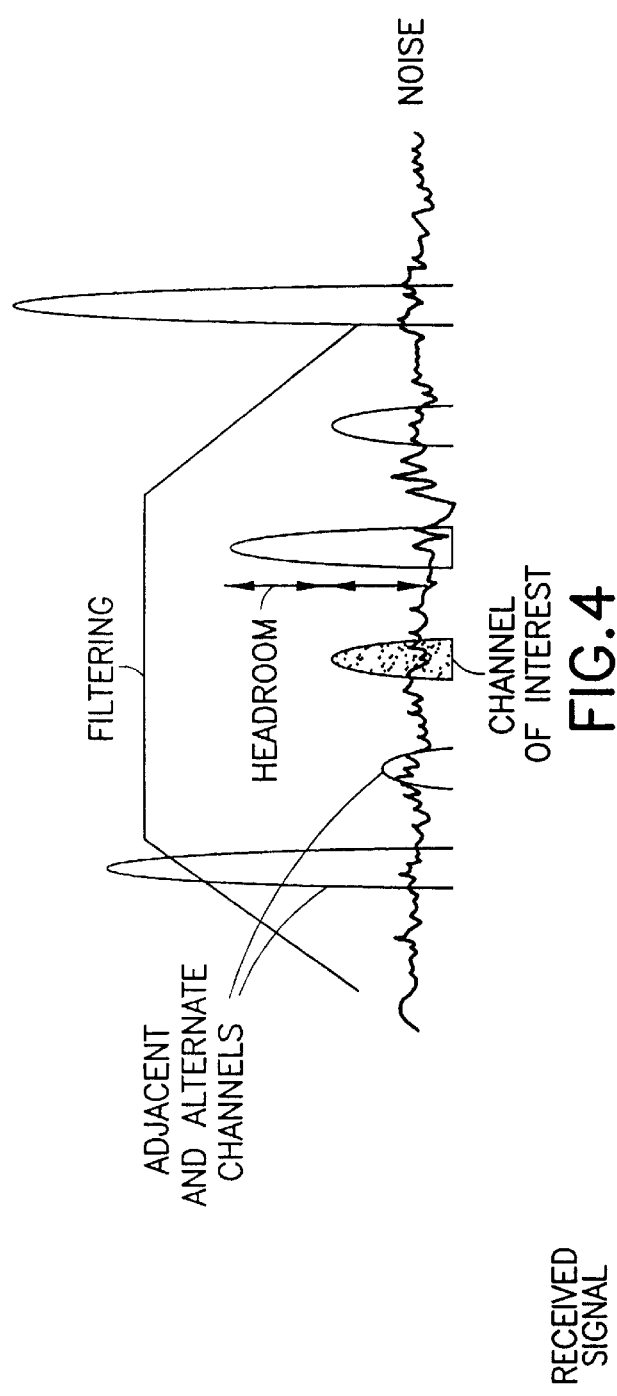
FIG. 4 is a diagram showing a frequency channel of interest in relation to a noise floor and to adjacent and alternate frequency channels, some of which may be interferers.

Reference in this regard can be had to FIG. 4, which shows a frequency channel of interest in relation to the noise floor, and to adjacent and alternate frequency channels, at least some of which may be interfering with the channel of interest (i.e., they are interferers). A typical receiver passband filter characteristic is also shown, as is the headroom associated with an interfering channel. In general, the receiver sensitivity is limited by the noise, while the receiver selectivity is limited by interferers in the adjacent and alternate channels. The performance of the receiver is normally designed to meet the worst case specification.

However, if little or no interference is present then less headroom and dynamic range is required, and a fewer number of RF ADC bits are sufficient to provide satisfactory operation.

It is a feature of these teachings that the signal quality analysis block 30 monitors the received signal strength (and/or some other signal characteristic), detects the current channel conditions, and adapts the sigma-delta modulator 10 to these conditions. The end result is a decrease in power consumption, as the sigma-delta modulator 10 is no longer operating in a mode that assumes the worst-case channel conditions. The converse is also true, i.e., in some circumstances of extremely impaired signal reception conditions it may be possible to program the sigma-delta modulator 10 to operate in a mode having characteristics that exceed the normal "worst-case" design criteria. While the power consumption may increase in this mode of operation, it may be possible to maintain a voice or data call despite the impaired channel conditions.

Figure 5:
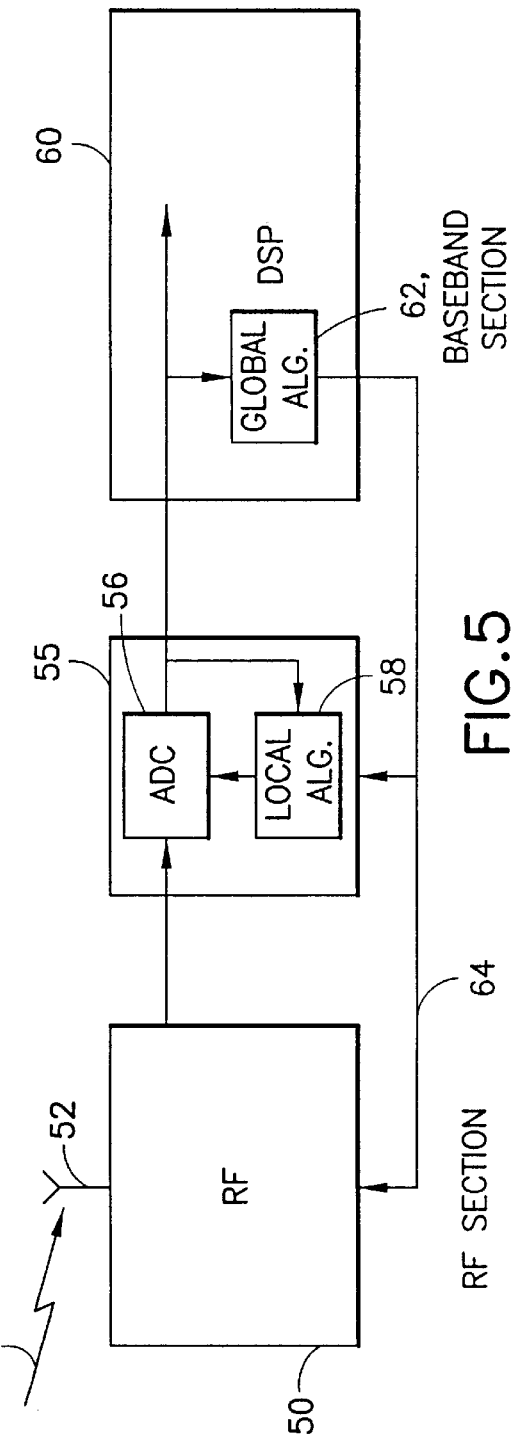
FIG. 5 is a simplified block diagram showing a mobile communications device having an RF section and a baseband section, and distributed signal quality algorithms for controlling the functioning of an ADC located between the RF and baseband sections.

FIG. 5 illustrates a further aspect of these teachings, wherein an RF block 50 includes an antenna 52 for receiving an RF signal of interest. The output of the RF block 50 feeds a conversion block 55 that contains an ADC 56, preferably constructed in accordance with the sigma-delta modulator 10 and decimation filter 12 of FIG. 3, and a local algorithm block 58. The local algorithm block 58 is provided to optimize the performance and power consumption of the ADC 56. This can be achieved by providing, for example, bias current self-adjustments to reduce or eliminate signal distortion. The ADC 56 provides a digital output to a DSP 60 or equivalent signal processor that implements a global algorithm for analyzing, optimizing and configuring the sigma-delta converter of the ADC 56, as well as the RF block 50, via feedback path 64.

EXAMPLE

As a non-limiting example of the technique for achieving the configuration of the sigma-delta modulator to multiple modes of operation, the following specifications for RF AD converters are assumed to support operation in different mobile communication systems. In practice the specifications may be different, depending on the specific receiver architecture and performance requirements.

GSM 900: 13bits, baseband bw=135 kHz

DAMPS: 12bits, baseband bw=16 kHz

IS-95: 7bits, baseband bw=630 kHz

WCDMA: 6 bits, baseband bw=2 MHz

In the foregoing, GSM 900 is the 900 MHz version of the Global System for Mobile Communications, DAMPS is Digital AMPS, IS-95 is a well-known standard for Code Division Multiple Access (CDMA) wireless communication, and WCDMA is wideband CDMA. The abbreviation "bw" represents bandwidth.

In this example the corresponding over-sampling ratios and sampling frequencies versus the order of the sigma-delta modulator 10 and the number of bits used in the quantizer 20 are shown in Tables 1–4. The configuration from one mode to another is most beneficially performed by changing the sampling frequency (Fs), the over-sampling ratio (OSR) and the number of quantized bits (#bits). In some cases it is advantageous also to change the modulator order.

A configurable GSM/WCDMA RF ADC converter for the specifications above can be constructed, for example, as follows. A third order modulator is used in GSM 900 mode with a one bit quantizer 20 and with a sampling frequency Fs of 6 MHz (5.67 MHz). The configuration to the WCDMA mode is performed by configuring the sigma-delta modulator (the quantizer of the modulator) to a four bit mode and by increasing the sampling frequency to 12 MHz. It should be apparent that this technique of configuring provides a very efficient implementation in terms of modulator structure, decimation filter implementation and clock logic circuitry.

Also, a configurable modulator to support other mobile systems, or other combinations of mobile systems, can be implemented with the parameters shown in Tables 1 through 4, or by the use of similar tables that are optimized for a particular mobile receiver implementation.

TABLE 1

GSM. Over-sampling ratio/sampling frequency [HZ]

| Modulator | Number of quantizer bits | | | |
|---|---|---|---|---|
| order | 1 (2 levels) | 2 (4 levels) | 3 (8 levels) | 4 (16 levels) |
| 2 | 47/12 690 000 | 36/9 720 000 | 27/7 290 000 | 21/5 670 000 |
| 3 | 21/5 670 000 | 17/4 590 000 | 14/3 780 000 | 12/3 240 000 |
| 4 | 14/3 780 000 | 12/3 240 000 | 10/2 700 000 | 9/2 430 000 |

TABLE 2

DAMPS. Over-sampling ratio/sampling frequency [Hz]

| Modulator | Number of quantizer bits | | | |
|---|---|---|---|---|
| order | 1 (2 levels) | 2 (4 levels) | 3 (8 levels) | 4 (16 levels) |
| 2 | 36/1 152 000 | 27/864 000 | 21/672 000 | 16/512 000 |
| 3 | 17/544 000 | 14/448 000 | 12/384 000 | 10/320 000 |
| 4 | 12/384 000 | 10/320 000 | 9/288 000 | 8/256 000 |

TABLE 3

IS-95. Over-sampling ratio/sampling frequency [Hz]

| Modulator | Number of quantizer bits | | | |
|---|---|---|---|---|
| order | 1 (2 levels) | 2 (4 levels) | 3 (8 levels) | 4 (16 levels) |
| 2 | 9/12 690 000 | 7/9 720 000 | 6/7 290 000 | 4/5 670 000 |
| 3 | 7/5 670 000 | 6/4 590 000 | 5/3 780 000 | 4/3 240 000 |
| 4 | 6/3 780 000 | 5/3 240 000 | 4/2 700 000 | 4/2 430 000 |

TABLE 4

WCDMA. Over-sampling ratio/sampling frequency [Hz]

| Modulator | Number of quantizer bits | | | |
|---|---|---|---|---|
| order | 1 (2 levels) | 2 (4 levels) | 3 (8 levels) | 4 (16 levels) |
| 2 | 7/28 000 000 | 6/24 000 000 | 4/16 000 000 | 3/12 000 000 |
| 3 | 6/24 000 000 | 5/20 000 000 | 4/16 000 000 | 3/12 000 000 |
| 4 | 5/20 000 000 | 4/16 000 000 | 4/16 000 000 | 3/12 000 000 |

Figure 7:
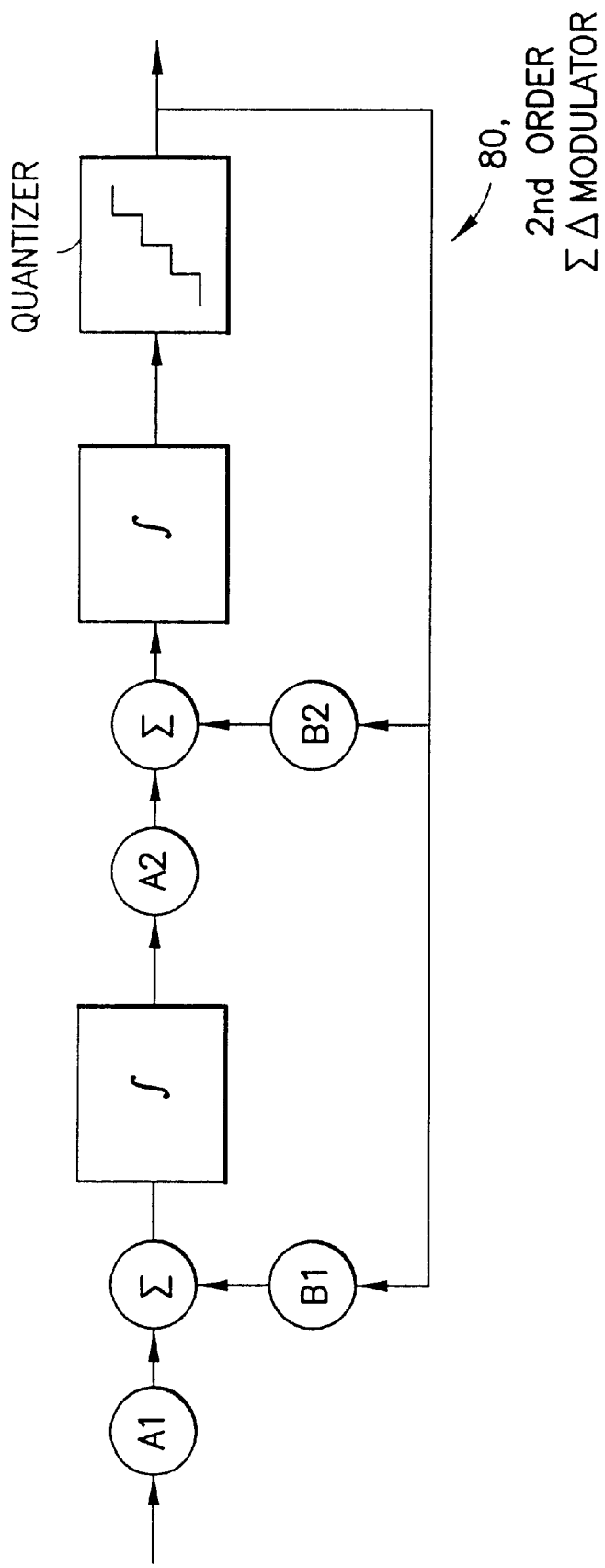
FIG. 7 is a diagram of second order sigma-delta modulator, and is useful when explaining a multi-mode configuration example.

The adaptation to prevailing signal conditions is performed by changing the number of the modulator bits during operation. Adaptation can be controlled by the measurement of SNR, BER or FER. The modulator coefficients can also be adapted each time the number of bits is altered. As an example, possible coefficients that can be used in the adaptation of the second order sigma-delta modulator 80 shown in FIG. 7 are shown in Table 5. In this example the A1–2 coefficients and B1–2 coefficients correspond to the feed forward and the feedback coefficients, respectively, of the distributed feedback topology shown in FIG. 7.

TABLE 5

Coefficients for a second order sigma-delta modulator

| #bits | A1 | A2 | B1 | B2 |
|---|---|---|---|---|
| 1 | 0.25 | 0.5 | 0.5 | 0.25 |
| 2 | 0.5 | 0.5 | 0.5 | 0.5 |
| 3 | 1.0 | 1.0 | 0.5 | 1.0 |

The coefficients for a higher order modulator and a greater number of bits can be found, for example, using the CLANS method (ref: Kenney, Carley: "CLANS: A High Level Tool for High Resolution Converters", Int. Conf. On Computer-Aided Design, vol.1, November 1988).

In these various embodiments of the invention it can be appreciated that what is provided is an adaptive SD converter that has a configurable converter core controlled by a signal quality analysis function. In a simplest form the signal quality analysis function can be implemented using the decimation filter 12, where the signal quality (i.e., the interferers) can be analyzed in the frequency domain. In the decimation filter 12 a first SINC stage corresponds to a widest bandwidth bandpass filter, the next SINC stage corresponds to a narrower bandwidth BP filter, and so forth. By measuring the signal and interference amplitudes (see FIG. 4) the minimum number of required converter bits can be determined, and a sufficient quantization resolution for the received signal can be achieved. This may be viewed as being somewhat analogous to an automatic gain control (AGC) function implemented in the RF analog-to-digital converter.

It should be appreciated, however, that the signal quality analysis function 30, 62 can be based on more than simply the relative signal amplitudes or signal strengths. For example, the signal quality analysis function can be based in whole or in part on, for example, bit error rate (BER) estimates or frame error rate estimates (FER). Other suitable signal quality metrics may be used as well, either alone or in combination.

In accordance with an aspect of these teachings the ADC converter core is implemented as a configurable structure such that the converter core can be configured to perform the AD conversion function in different types of mobile communication devices and/or in multi-mode devices. The performance of the signal converter implemented in this manner can be dynamically adapted to the temporary signal and interference conditions and, as a result, the performance of the RF ADC 56 in the receive path can be increased to provide adequate performance in poor signal conditions, or it can be decreased to lower power consumption in good signal conditions, without sacrificing performance of the receiver.

What is claimed is:

1. A configurable signal converter, comprising:
a programmable signal converter core comprising a sigma-delta modulator having a loop filter and a quantizer, said programmable signal converter core operable to perform analog-to-digital conversion functions on a signal received from a channel in accordance with different types of mobile communication device operational modes; and
a signal analysis function for analyzing said received signal for dynamically programming at least one of a number of quantization bits and loop filter coefficients of said sigma-delta modulator to adapt to current signal and interference conditions of the channel to achieve a more optimal performance-to-power consumption ratio of said signal converter.

2. A configurable signal converter as in claim 1, wherein said sigma-delta modulator is an oversampling sigma-delta modulator and further comprising a decimation filter having an input coupled to an output of said oversampling sigma-delta modulator, and where said signal analysis function is comprised of said decimation filter.

3. A configurable signal converter as in claim 1, wherein said sigma-delta modulator is an oversampling sigma-delta modulator and further comprising a decimation filter having an input coupled to an output of said oversampling sigma-delta modulator, and where said signal analysis function is comprised of a signal quality analysis function that is executed by a digital signal processor device having an input coupled to an output of said converter.

4. A configurable signal converter as in claim 1, where said signal analysis function is comprised of a decimation filter having an input coupled to an output of said quantizer, and where said signal converter is further programmed to change at least one of a number of quantizer comparators, decimation filter coefficients and word width.

5. A configurable signal converter as in claim 1, where said programmable signal converter core is programmed to change a loop filter transfer function and said loop filter coefficients.

6. A configurable signal converter as in claim 1, where said programmable signal converter core is further programmed to change sigma-delta modulator bias currents.

7. A configurable signal converter as in claim 1, where said programmable signal converter core is programmed to change a number of comparators that comprise said quantizer.

8. A configurable signal converter as in claim 1, wherein said sigma-delta modulator further includes a feedback path from an output of said quantizer, said feedback path comprising a dynamic element matching function, and where said programmable signal converter core is further programmed to change a type of dynamic element matching function that is used.

9. A configurable signal converter as in claim 1, wherein said sigma-delta modulator operates with an oversampling ratio (OSR), and where said programmable signal converter core is programmed to change said oversampling ratio.

10. A configurable signal converter as in claim 1, wherein said programmable signal converter core is programmed to change from a switched capacitor to a resistor-capacitor circuit technique, or vice versa.

11. A multimode communications device comprising an RF section and an analog-to-digital converter (ADC) located in a receive path between said RF section and a baseband section, said ADC comprising a programmable signal converter core comprising a sigma-delta modulator having a loop filter and a quantizer, said programmable signal converter core operable to perform ADC functions on a received RF signal in accordance with different types of mobile communication device operational modes, further comprising a multimode control function for programming said signal converter core as a function of a currently selected operational mode and a signal analysis function for analyzing current channel conditions for dynamically programming at least one of a number of quantization bits and loop filter coefficients of said sigma-delta modulator to adapt to the current channel conditions so as to achieve a more optimal performance-to-power consumption ratio.

12. A multimode communications device as in claim 11, where said ADC is further comprised of a decimation filter having an input coupled to an output of said quantizer, and where said ADC is programmed to change at least one of a number of quantizer comparators, decimation filter coefficients and word width.

13. A multimode communications device as in claim 11, wherein said programmable signal converter core is programmed to change from a switched capacitor to a resistor-capacitor circuit technique, or vice versa.

14. A multimode communications device as in claim 11, where said signal analysis function is comprised of a decimation filter having an input coupled to an output of said sigma-delta modulator.

15. A multimode communications device as in claim 11, where said signal analysis function is executed by a digital signal processor device that forms a portion of said baseband section.

16. A multimode communications device as in claim 11, wherein said sigma-delta modulator operates with an oversampling ratio (OSR), and where said programmable signal converter core is programmed to change said oversampling ratio.

17. A multimode communications device as in claim 11, where said programmable signal converter core is programmed to change a loop filter transfer function and said loop filter coefficients.

18. A multimode communications device as in claim 11, where said programmable signal converter core is further programmed to change sigma-delta modulator bias currents.

19. A multimode communications device as in claim 11, where said programmable signal converter core is programmed to change a number of comparators that comprise said quantizer.

20. A multimode communications device as in claim 11, wherein said sigma-delta modulator further includes a feedback path from an output of said quantizer, said feedback path comprising a dynamic element matching function, and where said programmable signal converter core is further programmed to change a type of dynamic element matching function that is used as a function of a selected mode.

21. A method for operating a signal converter, comprising:
providing a multimode communication device with a programmable signal converter core comprising a sigma-delta modulator having a loop filter and a quantizer, said programmable signal converter core operable to perform analog-to-digital conversion functions on a received signal in accordance with different types of mobile communication device operational modes;

analyzing the received signal for identifying changes in channel signal and interference conditions; and dynamically programming at least one of a number of quantization bits and loop filter coefficients of said sigma-delta modulator to adapt to the identified changes in channel signal and interference conditions to achieve a more optimal signal converter performance-to-power consumption ratio.

22. A method as in claim 21, where said programmable signal converter core is further comprised of a decimation filter having an input coupled to an output of said quantizer, and where dynamically programming changes at least one of a number of quantizer levels, and decimation filter coefficients and word width.

23. A method as in claim 21, wherein dynamically programming changes said programmable signal converter core from a switched capacitor to a resistor-capacitor circuit technique, or vice versa.

24. A method as in claim 21, wherein said sigma-delta modulator operates with an oversampling ratio (OSR), and where dynamically programming changes said oversampling ratio.

25. A method as in claim 21, where analyzing is performed by a decimation filter having an input coupled to an output of said sigma-delta modulator.

26. A method as in claim 21, where analyzing is performed by a digital signal processor device having an input coupled to an output of said sigma-delta modulator.

27. A method as in claim 21, where dynamically programming changes a number of bits used by said sigma-delta modulator.

28. A method as in claims 21, where dynamically programming changes a loop filter transfer function and the loop filter coefficients.

29. A method as in claim 21, where dynamically programming changes sigma-delta modulator bias currents.

30. A method as in claim 21, where dynamically programming changes a number of comparators that comprise said quantizer.

31. A method as in claim 21, wherein said sigma-delta modulator further includes a feedback path from an output of said quantizer, said feedback path comprising a dynamic element matching function, and where dynamically programming changes a type of dynamic element matching function that is used.

* * * * *